United States Patent
Kondo

(10) Patent No.: US 11,355,662 B2
(45) Date of Patent: Jun. 7, 2022

(54) METHOD OF MANUFACTURING NITRIDE SEMICONDUCTOR LIGHT EMITTING ELEMENT

(71) Applicant: NICHIA CORPORATION, Anan (JP)

(72) Inventor: Hiroki Kondo, Anan (JP)

(73) Assignee: NICHIA CORPORATION, Anan (JP)

( * ) Notice: Subject to any disclaimer, the term of this patent is extended or adjusted under 35 U.S.C. 154(b) by 259 days.

(21) Appl. No.: 16/874,123

(22) Filed: May 14, 2020

(65) Prior Publication Data

US 2020/0381580 A1    Dec. 3, 2020

(30) Foreign Application Priority Data

May 27, 2019   (JP) .............................. JP2019-098426

(51) Int. Cl.
| | |
|---|---|
| *H01L 33/00* | (2010.01) |
| *H01L 33/32* | (2010.01) |
| *H01L 33/02* | (2010.01) |
| *H01L 33/06* | (2010.01) |

(52) U.S. Cl.
CPC .......... *H01L 33/007* (2013.01); *H01L 33/025* (2013.01); *H01L 33/32* (2013.01); *H01L 33/325* (2013.01); *H01L 33/0095* (2013.01); *H01L 33/06* (2013.01); *H01L 2933/0016* (2013.01)

(58) Field of Classification Search
CPC ... H01L 33/007; H01L 33/0075; H01L 33/32; H01L 33/325
See application file for complete search history.

(56) References Cited

U.S. PATENT DOCUMENTS

| | | |
|---|---|---|
| 2004/0061433 A1 | 4/2004 | Izuno et al. |
| 2004/0072383 A1 | 4/2004 | Nagahama et al. |
| 2006/0128118 A1 | 6/2006 | Nagahama et al. |
| 2006/0267042 A1 | 11/2006 | Izuno et al. |
| 2008/0296609 A1 | 12/2008 | Nagahama et al. |
| 2012/0138889 A1* | 6/2012 | Tachibana ............... H01L 33/32 257/E33.048 |
| 2014/0153602 A1 | 6/2014 | Tachibana et al. |
| 2014/0183446 A1 | 7/2014 | Nago et al. |
| 2015/0084069 A1* | 3/2015 | Kushibe .................. H01L 33/32 438/22 |
| 2015/0270445 A1 | 9/2015 | Tachibana et al. |
| 2015/0318435 A1 | 11/2015 | Nago et al. |

(Continued)

FOREIGN PATENT DOCUMENTS

| | | |
|---|---|---|
| JP | 2004-266240 A | 9/2004 |
| JP | 2012-119515 A | 6/2012 |

(Continued)

*Primary Examiner* — Lauren R Bell
(74) *Attorney, Agent, or Firm* — Foley & Lardner LLP

(57) ABSTRACT

A method of manufacturing a nitride semiconductor light emitting element includes: growing an n-side nitride semiconductor layer; growing an active layer on the n-side nitride semiconductor layer; and growing a p-side nitride semiconductor layer on the active layer, which includes: growing a first p-side nitride semiconductor layer, growing a second p-side nitride semiconductor layer, growing a third p-side nitride semiconductor layer, and growing a fourth p-side nitride semiconductor layer, while varying flow rates of an Al source gas, a Ga source gas, an N source gas, and a Mg source gas.

20 Claims, 2 Drawing Sheets

(56) References Cited

U.S. PATENT DOCUMENTS

| | | | |
|---|---|---|---|
| 2016/0104816 A1* | 4/2016 | An | H01L 33/0075 257/101 |
| 2016/0240734 A1* | 8/2016 | Avramescu | H01S 5/3063 |
| 2017/0125632 A1* | 5/2017 | Watabe | H01L 33/32 |
| 2019/0067521 A1 | 2/2019 | Takano et al. | |

FOREIGN PATENT DOCUMENTS

| | | |
|---|---|---|
| JP | 2013-048266 A | 3/2013 |
| JP | 2014-127708 A | 7/2014 |
| JP | 2015-065245 A | 4/2015 |
| JP | 2017-139252 A | 8/2017 |

\* cited by examiner

METHOD OF MANUFACTURING NITRIDE SEMICONDUCTOR LIGHT EMITTING ELEMENT

CROSS-REFERENCE TO RELATED PATENT APPLICATION

The present application claims priority under 35 U.S.C. § 119 to Japanese Patent Application No. 2019-098426, filed May 27, 2019, the contents of which are incorporated herein by reference in their entirety.

BACKGROUND

The present disclosure relates to a method of manufacturing a nitride semiconductor light emitting element.

In recent years, light emitting elements employing nitride semiconductors and configured to emit light in a wide range of ultraviolet to green have been developed and used in a wide range of fields. The light emitting elements employing nitride semiconductors (nitride semiconductor light emitting elements) typically include Mg as a p-type dopant in p-type semiconductor layers. In such light emitting elements, due to a low activation rate of Mg, a sufficiently low operating voltage may not be obtained. In order to obtain a sufficiently low operation voltage, Japanese Patent Publication No. 2012-119515 (JP 2012-119515A) describes a multilayer structure of a p-type semiconductor layer disposed on an active layer, in which Mg is contained in each of the layers with the concentrations of Mg respectively adjusted to obtain a higher activation ratio of Mg.

SUMMARY

However, a sufficiently high activation ratio of Mg in the p-type semiconductor layer may still not be obtained in the structure disclosed in JP 2012-119515A. In particular, there is a tendency that the higher the Al mixed crystal ratio in the p-type semiconductor layer, the lower the Al mixed crystal ratio of Mg.

One object of certain embodiments of the present disclosure is to provide a method of manufacturing a nitride semiconductor light emitting element having a high activation ratio of Mg in a p-type semiconductor layer while achieving a low operating voltage.

According to one embodiment of the present disclosure, a method of manufacturing a nitride semiconductor light emitting element includes: growing an n-side nitride semiconductor layer, growing an active layer on the n-side nitride semiconductor layer, and growing a p-side nitride semiconductor layer on the active layer. The growing a p-side nitride semiconductor layer includes growing a first p-side nitride semiconductor layer, in which, source gases including an Al source gas, a Ga source gas, an N source gas, and a Mg source gas, are used, among the source gases, flow rates of the Al source gas, the Ga source gas, and the N source gas are set to obtain an Al mixed crystal ratio that is a content ratio of Al to a total content of Ga and N in the nitride semiconductor layer to be grown, at a first mixed crystal ratio in a range of 20% to 30%, and the Mg source gas is set to a first flow rate, a first p-side nitride semiconductor layer is grown on the active layer; growing a second p-side nitride semiconductor layer on the first nitride semiconductor layer. Using the source gases of the Al source gas, the Ga source gas, and the N source gas are set to obtain an Al mixed crystal ratio in a range of 6% to 10% (hereinafter referred to as a second mixed crystal ratio) in the nitride semiconductor layer, and the Mg source gas is set to a second flow rate that is smaller than the first flow rate; using the source gases, setting the flow rates of the sources gas to obtain the Al mixed crystal ratio in the nitride semiconductor layer the second mixed crystal ratio, and stop supplying the Mg source gas, growing a third p-side nitride semiconductor layer on the second p-side nitride semiconductor layer; and using the source gases, setting the flow rates of the sources gas to obtain the Al mixed crystal ratio in the nitride semiconductor layer the third mixed crystal ratio that is smaller than the second mixed crystal ratio, and the Mg source gas is set to a third flow rate that is greater than the first flow rate, growing a fourth p-side nitride semiconductor layer on the third p-side nitride semiconductor layer.

Using the method of manufacturing a nitride semiconductor light emitting element according to certain embodiments of the present disclosure, an activation ratio of Mg in the p-type semiconductor layer can be enhanced, allowing for manufacturing a nitride semiconductor light emitting element with low operating voltage.

DETAILED DESCRIPTION

Next, embodiments of the present invention will be described in detail below with reference to the drawings. In the description below, when appropriate, terms that indicate specific directions or locations (for example, "up", "down", "right", "left" and other terms expressing those) may be applied. But those terms are used for easy understanding of the disclosure with reference to the accompanying drawings, and thus the technical scope of the disclosure shall not be limited by the meaning of those terms.

As described above, nitride semiconductor light emitting elements employing Mg-doped p-type nitride semiconductor layers may experience low Mg activation rates in the p-type semiconductor layers, which are insufficient to reduce operation voltages. This is more significant when the mixed ratio of Al is high in the p-type semiconductor layers. Increasing the amount of Mg doping into the p-side nitride semiconductor layer in order to compensate for the low Mg activation ratio may cause a decrease in the optical transmittance in the p-side nitride semiconductor layer, causing a reduction in the luminous efficiency. The present inventor has intensively studied structures that facilitate activation of Mg around a p-type cladding layer while reducing reduction of optical transmittance, and thus the present invention has been developed.

As a result, it was confirmed that providing an undoped AlGaN layer grown without doping Mg between a p-type cladding layer and a p-type contact layer in the p-side nitride semiconductor layer disposed on the active layer allows for obtaining a high Mg activation rate in the p-type cladding layer, while reducing reduction of the optical transmittance.

As a result of further study, it was confirmed that growing the layer between the p-type cladding layer and the p-type contact layer as two separate layers—a lightly doped layer grown with a smaller amount of Mg source gas than that in growing a p-cladding layer, and an undoped layer grown while stopping the Mg source gas—can further increase the activation ratio of Mg in the p-side nitride semiconductor layer. It was further confirmed that even with the lightly-doped layer, the reduction in the optical transmittance of the p-side nitride semiconductor layer was impeded.

In the present specification, the term "undoped layer" refers to a layer grown without doping a p-type dopant or an n-type dopant. For example, when an undoped layer is grown by using a metal organic chemical vapor deposition (MOCVD) method, the term "undoped layer" refers to a layer grown without supplying a dopant source gas.

A method of manufacturing a nitride semiconductor light emitting element according to certain embodiments of the present disclosure has been developed based on the findings by the present inventor.

The method of manufacturing a nitride semiconductor light emitting element according to certain embodiments of the present disclosure will be described below.

Figure 1:
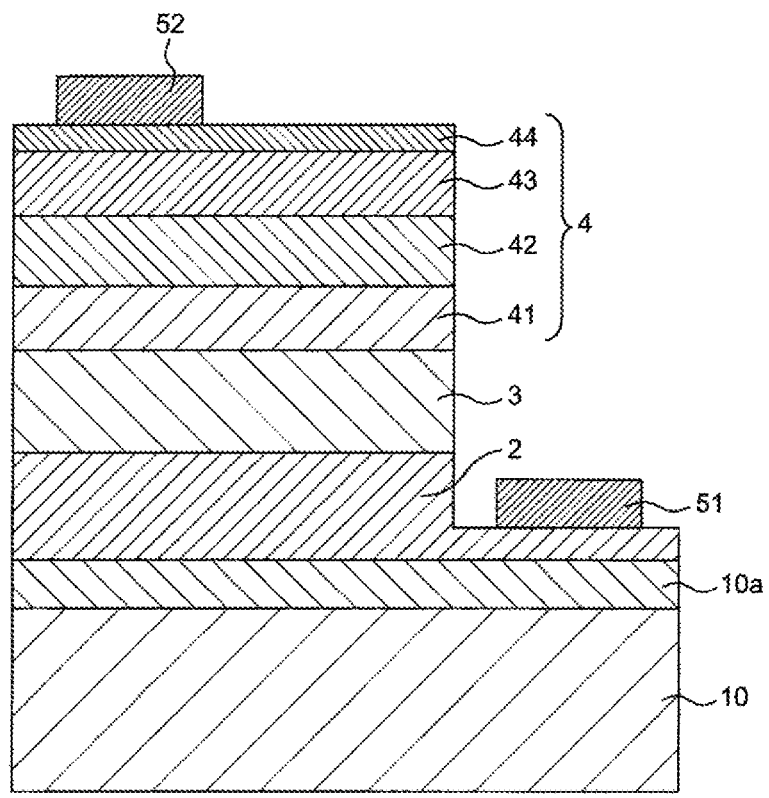
FIG. 1 is a cross-sectional view schematically showing a configuration of a nitride semiconductor light emitting element obtained according to a method of manufacturing according to one embodiment of the present disclosure.

FIG. 1 is a schematic cross-sectional view of a nitride semiconductor light emitting element obtained using a method of manufacturing a nitride semiconductor light emitting element according to one embodiment. The nitride semiconductor light emitting element shown in FIG. 1 includes, for example, a growth substrate 10 made of sapphire; a buffer layer 10a; and an n-side nitride semiconductor layer 2, an active layer 3, and a p-side nitride semiconductor layer 4; grown on the growth substrate 10 in this order.

The p-side nitride semiconductor layer 4 further includes, from the active layer 3 side, for example, a first p-side nitride semiconductor layer 41, a second p-side nitride semiconductor layer 42 grown with the flow rate of the Mg source gas reduced from that in growing the first p-side nitride semiconductor layer 41, a third p-side nitride semiconductor layer 43 grown while stopping supply of the Mg source gas, and a fourth p-side nitride semiconductor layer 44 grown with the flow rate of the Mg source gas increased from that in growing the first p-side nitride semiconductor layer 41.

The first p-type nitride semiconductor layer 41 is formed such that the Al mixed crystal ratio satisfies a first mixed crystal ratio that is in a range of 20% to 30%, the second p-type nitride semiconductor layer 42 is formed such that the Al mixed crystal ratio satisfies a second mixed crystal ratio that is in a range of 6% to 10%, the third p-type nitride semiconductor layer 43 is formed such that the Al mixed crystal ratio satisfies the second mixed crystal ratio, and the fourth p-type nitride semiconductor layer 44 is formed such that the Al mixed crystal ratio satisfies a third mixed crystal ratio that is smaller than the second mixed crystal ratio.

Due to the first p-type nitride semiconductor layer 41 having a higher Al mixed crystal ratio with respect to other p-side nitride semiconductor layers, Mg, which is a p-type dopant, is less likely to be effectively activated. This may result in insufficient supply of positive holes from the first p-side nitride semiconductor layer 41 to the active layer 3. In the nitride semiconductor light emitting element according to the present embodiment, the second p-type nitride semiconductor layer 42 having an Al mixed crystal ratio lower than that in the first p-side nitride semiconductor layer 41 is disposed between the first p-side nitride semiconductor layer 41 and the third nitride semiconductor layer 43. Thus, by lightly doping Mg in the second p-side nitride semiconductor layer 42 that has a low Al mixed crystal ratio and can efficiently activate Mg, activation of Mg around the p-cladding layer disposed adjacent to the active layer 3 can be facilitated. As a result, efficient supply of positive holes from the p-side nitride semiconductor layer 4 to the active layer 3 can be achieved, and the operating voltage can be reduced.

Further, because the activation of Mg can be facilitated by the second p-side nitride semiconductor layer 42 that is lightly doped with Mg, a desired p-type conductivity can be realized with a relatively small amount of Mg doped in the first p-side nitride semiconductor layer 41. This allows for a reduction in the amount of Mg doped in the first p-side nitride semiconductor layer 41, which further allows for a reduction in the amount of Mg diffused from the first p-side nitride semiconductor layer 41 to the active layer 3. As a result, preferable crystallinity of the active layer 3 can be achieved, and luminous efficiency and reliability of the light emitting element can be improved.

The nitride semiconductor light emitting element shown in FIG. 1 having a structure described above has the p-side nitride semiconductor layer 4 including the first p-side nitride semiconductor layer 41, the second p-side nitride semiconductor layer 42, the third p-side nitride semiconductor layer 43, and the fourth nitride semiconductor layer 44. This configuration allows for enhancing activation ratio of Mg in the p-side nitride semiconductor layer 4 while impeding a reduction in the optical transmittance of the p-side nitride semiconductor layer 4. Accordingly, a nitride semiconductor light emitting element with a low operating voltage can be provided.

A method of manufacturing a nitride semiconductor light emitting element according to certain embodiments of the present disclosure will be described in detail below.

Figure 2:
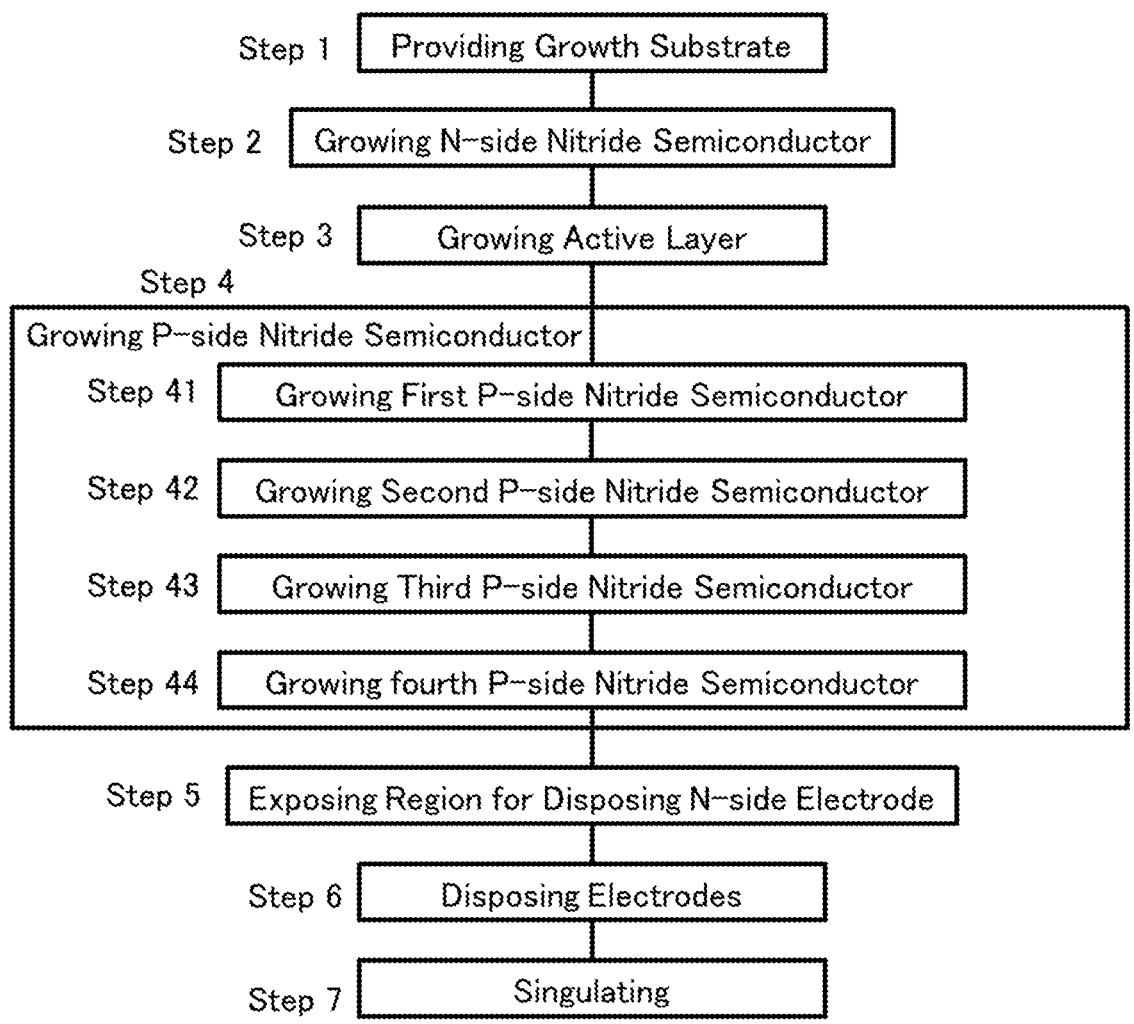
FIG. 2 is a flow diagram of a method of manufacturing a nitride semiconductor light emitting element according to one embodiment of the present disclosure.

The method of manufacturing a nitride semiconductor light emitting element according to the present embodiment includes, as shown in FIG. 2, providing a growth substrate (Step 1), growing an n-side nitride semiconductor layer to grow an n-side nitride semiconductor layer 2 (Step 2), growing an active layer (Step 3) in which an active layer 3 is grown on the n-side nitride semiconductor layer 2, and growing a p-side nitride semiconductor layer (Step 4) in which a p-side nitride semiconductor layer 4 is grown on the active layer 3.

Further, when manufacturing the nitride semiconductor light emitting element shown in FIG. 1, the manufacturing further includes exposing a region for n-side electrode (Step 5) to expose a region provided for an n-side electrode 51, disposing electrode (Step 6) in which an n-side electrode 51 and a p-side electrode 52 are disposed, and singulating (Step 7) in which a plurality of light emitting elements collectively formed on the growth substrate 10 are divided into individual light emitting elements.

Further, the step of growing a p-side nitride semiconductor layer (Step 4) includes growing a first p-side nitride semiconductor layer (Step 41), growing a second p-side nitride semiconductor layer (Step 42), growing a third p-side nitride semiconductor layer (Step 43), and growing a fourth p-side nitride semiconductor layer (Step 44).

The respective steps will be described more specifically below.

Examples of the source gases used in a metal organic chemical vapor deposition (MOCVD) method illustrated below as a method for growing a nitride semiconductor layer include:

Ga source gas: trimethylgallium (TMG), trimethylgallium (TEG)
N source gas: $N_2$
In source gas: trimethylindium (TMI)
Al source gas: trimethylaluminium (TMA)
Si source gas: monosilane ($SiH_4$)
Mg source gas: cyclopentadienylmagnesium ($Cp_2Mg$)

1. Providing Growth Substrate (Step 1)

In the step of providing a growth substrate (Step 1), for example, a sapphire substrate is provided as the growth substrate 10. A sapphire substrate is light-transmissive to visible light and ultraviolet light, and also suitable for a substrate of the nitride semiconductor light emitting element, configured to emit light from the substrate side. For the growth substrate 10, for example, a sapphire substrate whose upper surface is a C-plane is provided, preferably, a sapphire substrate whose upper surface is inclined toward an a-axis direction or an m-axis direction with respect to a C-plane at an angle in a range of 0.1° to 2° is provided.

The step of providing growth substrate (Step 1) includes a step of disposing a buffer layer 10a on the upper surface of the growth substrate 10. The buffer layer 10a includes, for example, a GaN layer or an AlGaN layer grown on the upper surface of the growth substrate 10. With the buffer layer 10a grown on the upper surface of the growth substrate 10, lattice mismatch between the nitride semiconductor layer and sapphire can be reduced.

The step of disposing a buffer layer 10a may further include disposing a superlattice layer formed by alternately disposing a first layer having a first lattice constant and a second layer having a second lattice constant greater than the first lattice constant. The superlattice layer may be formed by, for example, alternatively growing an aluminum nitride (AlN) layer and an aluminum gallium nitride (AlGaN) layer.

2. Growing N-Side Nitride Semiconductor Layer (Step 2)

In the step of growing the n-side nitride semiconductor layer (Step 2), an n-side nitride semiconductor layer 2 is grown on the buffer layer 10a by using, for example, organic metal chemical vapor phase growth (MOCVD) method. The n-side nitride semiconductor layer 2 may be disposed by growing one or two or more layers having different composition. The n-side nitride semiconductor layer 2 may include a composition-graded layer having compositions continuously or stepwise toward the active layer 3. Accordingly, preferable crystallinity of the n-side nitride semiconductor layer 2 and also of the active layer 3 to be grown can be obtained.

For example, for the nitride semiconductor light emitting element configured to emit ultraviolet light, a composition-graded layer is formed by, for example, growing an aluminum gallium nitride layer containing an n-type impurity with lowering the Al mixed crystal ratio continuously or stepwise toward the active layer 3. When such a composition-graded layer is included, a minimum value of the Al mixed crystal ratio in the composition-graded layer is set such that light emitted from the active layer is not absorbed by the composition-graded layer. The n-side nitride semiconductor layer 2 may further include an undoped composition-graded layer at the growth substrate 10 side and a composition-graded layer containing the n-type dopant described above at the active layer 3 side.

3. Growing Active Layer (Step 3)

In the step of growing the active layer (Step 3), an active layer 3 is grown on the n-side nitride semiconductor layer 2 using, for example, a metal organic chemical vapor deposition method. The active layer 3 has, for example, a quantum well structure containing well layer and barrier layers, which may be produced by depositing alternating layers of barrier layers and well layers.

The well layers and the barrier layers may be made of, for example, Group-III nitrides represented by a general formula $In_aAl_bGa_{1-a-b}N$ ($0 \leq a \leq 0.1$, $0.4 \leq b \leq 1.0$, $a+b \leq 1.0$), in which the In mixed crystal ratio, the Al mixed crystal ratio, and the Ga mixed crystal ratio are determined corresponding to a predetermined emission wavelength and appropriately adjusting the flow rates of an In source gas, an Al source gas, a Ga source gas, and a N source gas. When the peak emission wavelength of light emitted from the active layer 3 is set in a range of 350 nm to 410 nm, the well layers are made by, for example, using Group III nitride semiconductors represented by $In_bGa_{1-b}N$ ($0 \leq b \leq 0.09$). When an active layer 3 adapted to emit light with a peak wavelength in a range of 350 nm to 410 nm is used, the Al mixed crystal ratio should be relatively high in order to efficiently block electrons by the first p-side nitride semiconductor layer 41. Using the method of manufacturing according to the present embodiment, activation of Mg in the p-side nitride semiconductor layer 4 can be facilitated even when the first p-side nitride semiconductor layer 41 having a relatively high Al mixed crystal ratio. Thus, the method of manufacturing according to the present embodiment can be more efficient when employing an active layer 3 to emit light with a peak wavelength in a range of 350 nm to 410 nm. The light emitted from the active layer 3 may have a peak wavelength of, for example, 365 nm or 405 nm.

4. Growing P-Side Nitride Semiconductor Layer (Step 4)

The step of growing a p-side nitride semiconductor layer (Step 4) includes growing a first p-side nitride semiconductor layer (Step 41), growing a second p-side nitride semiconductor layer (Step 42), growing a third p-side nitride semiconductor layer (Step 43), and growing a fourth p-side nitride semiconductor layer (Step 44).

4-1 Growing First P-Side Nitride Semiconductor Layer (Step 41)

In the step of growing the first p-side nitride semiconductor layer (Step 41), the first p-side nitride semiconductor layer 41 is grown on the active layer by using source gases including an Al source gas, a Ga source gas, an N source gas, and a Mg source gas. In this step of growing a first p-side nitride semiconductor layer (Step 41), flow rates of the Al source gas, the Ga source gas, the N source gas, and the Mg source gas are adjusted such that the Al mixed crystal ratio in the first p-side nitride semiconductor layer 41 satisfies a first mixed crystal ratio in a range of 20% to 30%. In the present specification, "Al mixed crystal ratio" refers to a content ratio of aluminum with respect to a total content of gallium and aluminum in AlGaN. The flow rate of the Mg source gas (first flow rate) in the step of growing a first p-side nitride semiconductor layer 41 (Step 41) is appropriately adjusted in view of the function of the first p-side nitride semiconductor layer 41 as a p-type cladding layer. The dopant concentration, that is, the Mg concentration in the first p-side nitride semiconductor layer 41 is determined in a range of $1 \times 10^{19}/cm^3$ to $1 \times 10^{20}/cm^3$, preferably in a range of $1.5 \times 10^{19}/cm^3$ to $3.5 \times 10^{19}/cm^3$, in view of the Mg concentration in the second p-side nitride semiconductor layer 42 to the fourth p-side nitride semiconductor layer 44. Further, the first p-side nitride semiconductor layer 41 is grown to a thickness, for example, in a range of 20 nm to 30 nm, preferably in a range of 20 nm to 25 nm.

4-2 Growing Second P-Side Nitride Semiconductor Layer (Step 42)

In the step of growing the second p-side nitride semiconductor layer (Step 42), a second p-side nitride semiconductor layer 42 is grown on the first p-side nitride semiconductor layer 41, in which, similar to the step of growing a first p-side semiconductor layer (Step 41), using the source gases including the Al source gas, the Ga source gas, the N source gas, and the Mg source gas, a second p-side nitride semiconductor layer 42 is grown on the first p-side nitride semiconductor layer 41. In the step of growing a second p-side nitride semiconductor layer (Step 42), the second p-side nitride semiconductor layer 42 is grown such that the flow rates of the Al source gas, the Ga source gas, the N source gas, and the Mg source gas are respectively set to obtain an Al mixed crystal ratio (second mixed crystal ratio) in the second p-side nitride semiconductor layer 42 in a range of 6% to 10%, and the Mg source gas is set to a second flow rate that is smaller than the first flow rate.

In the step of growing the second p-side nitride semiconductor layer (Step 42), the second flow rate of the Mg source gas is preferably set to a ⅕ or less of the first flow rate, more preferably to a ⅛ or less of the first flow rate.

Also in the step of growing a second p-side nitride semiconductor layer (Step 42), the second p-side nitride semiconductor layer 42 is preferably grown to a thickness similar to the thickness of the first p-side nitride semiconductor layer 41, more preferably grown to a thickness greater than the thickness of the first p-side nitride semiconductor layer 41. Further, in the step of growing the second p-side nitride semiconductor layer (Step 42), the second p-side nitride semiconductor layer 42 is preferably grown to a thickness in a range of 10 nm to 50 nm. In view of crystallinity and a reduction in the optical transmittance due to doping Mg as the p-type dopant, the second p-side nitride semiconductor layer 42 is preferably formed with a thickness smaller than the thickness of the third p-side nitride semiconductor layer 43.

4-3 Growing Third P-Side Nitride Semiconductor Layer (Step 43)

In the step of growing the third p-side nitride semiconductor layer (Step 43), the third p-side nitride semiconductor layer 43 is grown on the second p-side nitride semiconductor layer 42 by using source gases including an Al source gas, a Ga source gas, an N source gas, and a Mg source gas, as in the step of growing the first p-side semiconductor layer (Step 41) and the step of growing the second p-side nitride semiconductor layer (Step 42). In the step of growing the third p-side nitride semiconductor layer (Step 43), the third p-side nitride semiconductor layer 43 is grown such that the flow rates of the Al source gas, the Ga source gas, the N source gas, and the Mg source gas are respectively set to obtain an Al mixed crystal ratio in the third p-side nitride semiconductor layer 43 to be the second mixed crystal ratio, and the Mg source gas is stopped. That is, the third p-side nitride semiconductor layer 43 grown in the step of growing the third p-side nitride semiconductor layer (Step 43) is an undoped layer having the same composition as that of the second p-side nitride semiconductor layer 42. Further, in the step of growing the third p-side nitride semiconductor layer (Step 43), the third p-side nitride semiconductor layer 43 is preferably grown to a thickness in a range of 40 nm to 150 nm.

4-4 Growing Fourth P-Side Nitride Semiconductor Layer (Step 44)

In the step of growing the fourth p-side nitride semiconductor layer (Step 44), the fourth p-side nitride semiconductor layer 44 is grown on the third p-side nitride semiconductor layer 43 by using source gases including an Al source gas, a Ga source gas, an N source gas, and a Mg source gas, as in the step of growing the first p-side semiconductor layer (Step 41) and the step of growing the second p-side nitride semiconductor layer (Step 42). In the step of growing the fourth p-side nitride semiconductor layer (Step 44), the fourth p-side nitride semiconductor layer 44 is grown such that the flow rates of the Al source gas, the Ga source gas, the N source gas, and the Mg source gas are respectively set to obtain an Al mixed crystal ratio (third mixed crystal ratio) that is smaller than the second mixed crystal ratio, and the Mg source gas is set to a third flow rate that is greater than the first flow rate. The fourth p-side nitride semiconductor layer 44 grown as described above has an Al mixed crystal ratio smaller and a concentration of Mg greater than any of the first p-side nitride semiconductor layer 41, the second p-side nitride semiconductor layer 42, and the third p-side nitride semiconductor layer 43.

In the step of growing the fourth p-side nitride semiconductor layer (Step 44), the third flow rate is preferably 1.5 times or greater than the first flow rate, more preferably 2 times or greater than the first flow rate. In the step of growing the fourth p-side nitride semiconductor layer (Step 44), the fourth p-side nitride semiconductor layer 44 is preferably grown to a thickness in a range of 10 nm to 15 nm.

5. Exposing Region for Disposing N-Side Electrode (Step 5)

In the step of exposing the region for disposing the n-side electrode (Step 5), a portion of the p-side nitride semiconductor layer 4 and a portion of the active layer 3 are removed to expose a region for disposing n-side electrode.

More specifically, a mask is disposed on a portion of the n-side nitride semiconductor layer 4 and a portion of the p-side nitride semiconductor layer 4 and a corresponding portion of the active layer 3 which are not covered by the mask are removed by using dry etching, to expose the n-side nitride semiconductor layer 2. The region of the nitride semiconductor layer 2 exposed in this step corresponds to a region for disposing an n-side electrode.

6. Disposing Electrode (Step 6)

In the step of disposing the electrodes (Step 6), an n-electrode 51 and a p-electrode 52 are disposed.

The n-electrode 51 can be disposed, for example, by disposing a mask defining opening corresponding to the exposed region for disposing n-side electrode and covering other portion of the surface of the semiconductor layer (upper surface and lateral surfaces of the p-side nitride semiconductor layer 4 and lateral surfaces of the active layer 3), then, through the opening of the mask, disposing the n-electrode 51, and removing the mask.

The n-electrode 51 can be formed by, for example, using a sputtering method.

The n-electrode 51 may be made of a metal such as Ni, Au, W, Pt, Al, Rh, or Ti, or has a multilayer structure made of two or more of those metals.

The p-electrode 52 can be disposed, for example, by disposing a mask defining opening corresponding to a portion of the fourth p-side nitride semiconductor layer 44 for disposing p-electrode 52 and covering other portion of the surface of the semiconductor layer and the n-electrode 51, then, through the opening of the mask, disposing the p-electrode 52, and removing the mask.

The p-electrode 52 can be formed by using a sputtering method.

For the p-electrode 52, for example, a metal such as Ag or Al, or an alloy having those metals as its main components.

7. Singulating (Step 7)

In the step of singulating (Step 7), the plurality of light emitting elements collectively disposed on the growth substrate 10 are separating from each other into individual light emitting elements.

The nitride semiconductor light emitting element manufactured as described above has a p-side nitride semiconductor layer 4 including the first p-side nitride semiconductor layer 41, the second p-side nitride semiconductor layer 42, the third p-side nitride semiconductor layer 43, and the fourth nitride semiconductor layer 44. This configuration allows for enhancing activation ratio of Mg in the p-side nitride semiconductor layer 4 while impeding a reduction in the optical transmittance of the p-side nitride semiconductor layer 4. Accordingly, using the method of manufacturing light emitting element according to the present embodiment, a nitride semiconductor light emitting element with a low operating voltage can be produced.

EXAMPLES

Example 1

A light emitting element according to Example 1 is manufactured as described below.

Providing a sapphire substrate 10 having C-plane as its upper surface and a buffer layer 11 made of undoped GaN was disposed on the upper surface of the sapphire substrate 10.

Subsequently, on the buffer layer 11, an n-side nitride semiconductor layer 2 having an undoped GaN layer and an AlGaN layer doped with Si as an n-type dopant was disposed.

Then, on the n-side nitride semiconductor layer 2, an active layer 3 having multi-quantum well structure alternately layering five pairs of a barrier layer made of $Al_{0.095}Ga_{0.905}N$ with an Al mixed crystal ratio of 0.095 and a well layer made of InGaN was disposed.

Subsequently, on the active layer 3, a first p-side nitride semiconductor layer 41 made of $Al_{0.25}Ga_{0.75}N$ with an Al mixed crystal ratio of 0.25 was grown to a thickness of 22.5 nm. In Example 1, $Cp_2Mg$ was used as the Mg source gas, and the first p-side nitride semiconductor layer 41 was grown with a flow rate of $Cp_2Mg$ set to 48 sccm.

Next, a second p-side nitride semiconductor layer 42 made of $Al_{0.085}Ga_{0.915}N$ with an Al mixed crystal ratio of 0.085 was grown to a thickness of 50 nm. In Example 1, the second p-side nitride semiconductor layer 42 was grown with a flow rate of $Cp_2Mg$ set to 6 sccm.

Next, a third p-side nitride semiconductor layer 43 made of $Al_{0.085}Ga_{0.915}N$ with an Al mixed crystal ratio of 0.085 was grown to a thickness of 55 nm. In Example 1, the third p-side nitride semiconductor layer 43 was grown without supplying $Cp_2Mg$.

Next, a fourth p-side nitride semiconductor layer 44 made of $Al_{0.065}Ga_{0.935}N$ with an Al mixed crystal ratio of 0.065 was grown to a thickness of 12 nm. In Example 1, the fourth p-side nitride semiconductor layer 44 was grown with a flow rate of $Cp_2Mg$ set to 101 sccm.

Subsequently, a portion of the p-side nitride semiconductor layer 4 and a portion of the active layer 3 were removed to expose a region for disposing an n-electrode, and an n-electrode 51 was disposed to be in contact with the region for n-side electrode, and a p-electrode 52 was disposed on the fourth p-side nitride semiconductor layer 44.

A light emitting element according to Example 1 was manufactured as described above.

Reference Example 1

A light emitting element according to Reference Example 1 was fabricated in a similar manner as in Example 1, except for disposing the second p-side nitride semiconductor layer 42 and the third p-side nitride semiconductor layer was grown without supplying $Cp_2Mg$ of Mg source gas and to a thickness of 105 nm.

Forward voltage Vf and emission intensity when supplying 100 mA of electric current to the light emitting element fabricated in Example 1 and Reference Example 1 were evaluated.

The results were such that the forward voltage Vf of the light emitting element of Example 1 was 3.725 V, while the forward voltage Vf of the light emitting element of Reference Example 1 was 3.755 V. The emission intensity of the light emitting element 1 of Example 1 was 49 mW, while the emission intensity of the light emitting element of Reference Example 1 was 48 mW.

As described above, the light emitting element of Example 1 containing the second p-side nitride semiconductor layer 42 exhibited lower forward voltage Vf at 100 mA and higher emission intensity with respect to the light emitting element of Reference Example 1.

It is to be understood that although the present invention has been described with regard to certain embodiments thereof, various other embodiments and variants may occur to those skilled in the art, which are within the scope and spirit of the invention, and such other embodiments and variants are intended to be covered by the following claims.

What is claimed is:

1. A method of manufacturing a nitride semiconductor light emitting element, the method comprising:
   growing an n-side nitride semiconductor layer;
   growing an active layer on the n-side nitride semiconductor layer; and
   growing a p-side nitride semiconductor layer on the active layer, which comprises:
      growing a first p-side nitride semiconductor layer on the active layer using source gases comprising an Al source gas, a Ga source gas, an N source gas, and a Mg source gas, which comprises setting flow rates of the Al source gas, the Ga source gas, and the N source gas to obtain an Al mixed crystal ratio, which is a content ratio of Al to a total content of Ga and N in the nitride semiconductor layer to be grown, at a first mixed crystal ratio in a range of 20% to 30%, while setting a flow rate of the Mg source gas to a first flow rate,
      growing a second p-side nitride semiconductor layer on the first p-side nitride semiconductor layer, which comprises setting flow rates of the Al source gas, the Ga source gas, and the N source gas to obtain an Al mixed crystal ratio in the nitride semiconductor layer at a second mixed crystal ratio in a range of 6% to 10%, while setting a flow rate of the Mg source gas to a second flow rate that is smaller than the first flow rate,
      growing a third p-side nitride semiconductor layer on the second p-side nitride semiconductor layer, which comprises setting flow rates of the Al source gas, the Ga source gas, and the N source gas to obtain the Al mixed crystal ratio in the nitride semiconductor layer at the second mixed crystal ratio, while stopping supply of the Mg source gas, and
      growing a fourth p-side nitride semiconductor layer on the third p-side nitride semiconductor layer, which comprises setting flow rates of the Al source gas, the Ga source gas, and the N source gas to obtain an Al mixed crystal ratio in the nitride semiconductor layer at a third mixed crystal ratio that is smaller than the second mixed crystal ratio, while setting a flow rate of the Mg source gas to a third flow rate that is greater than the first flow rate.

2. The method of manufacturing a nitride semiconductor light emitting element according to claim 1, wherein the second flow rate is not greater than a ⅕ of the first flow rate.

3. The method of manufacturing a nitride semiconductor light emitting element according to claim 2, wherein the third flow rate is not less than twice the first flow rate.

4. The method of manufacturing a nitride semiconductor light emitting element according to claim 2, wherein, in the step of growing the second p-side nitride semiconductor layer, the second p-side nitride semiconductor layer is grown with a thickness greater than a thickness of the first p-side nitride semiconductor layer.

5. The method of manufacturing a nitride semiconductor emitted element according to claim 2, wherein, in the step of growing the first p-side nitride semiconductor layer, the first p-side nitride semiconductor layer is grown to a thickness in a range of 20 nm to 30 nm.

6. The method of manufacturing a nitride semiconductor light emitting element according to claim 2, wherein, in the step of growing the second p-side nitride semiconductor layer, the second nitride semiconductor layer is grown to a thickness in a range of 10 nm to 50 nm.

7. The method of manufacturing a nitride semiconductor light emitting element according to claim 2, wherein, in the step of growing the third p-side nitride semiconductor layer, the third nitride semiconductor layer is grown to a thickness in a range of 40 nm to 150 nm.

8. The method of manufacturing a nitride semiconductor light emitting element according to claim 2, wherein, in the step of growing the fourth p-side nitride semiconductor layer, the fourth nitride semiconductor layer is grown to a thickness in a range of 10 nm to 15 nm.

9. The method of manufacturing a nitride semiconductor light emitting element according to claim 1, wherein the third flow rate is not less than twice the first flow rate.

10. The method of manufacturing a nitride semiconductor light emitting element according to claim 9, wherein, in the step of growing the second p-side nitride semiconductor layer, the second p-side nitride semiconductor layer is grown with a thickness greater than a thickness of the first p-side nitride semiconductor layer.

11. The method of manufacturing a nitride semiconductor emitted element according to claim 9, wherein, in the step of growing the first p-side nitride semiconductor layer, the first p-side nitride semiconductor layer is grown to a thickness in a range of 20 nm to 30 nm.

12. The method of manufacturing a nitride semiconductor light emitting element according to claim 1, wherein, in the step of growing the second p-side nitride semiconductor layer, the second p-side nitride semiconductor layer is grown with a thickness greater than a thickness of the first p-side nitride semiconductor layer.

13. The method of manufacturing a nitride semiconductor emitted element according to claim 1, wherein, in the step of growing the first p-side nitride semiconductor layer, the first p-side nitride semiconductor layer is grown to a thickness in a range of 20 nm to 30 nm.

14. The method of manufacturing a nitride semiconductor light emitting element according to claim 13, wherein, in the step of growing the second p-side nitride semiconductor layer, the second nitride semiconductor layer is grown to a thickness in a range of 10 nm to 50 nm.

15. The method of manufacturing a nitride semiconductor light emitting element according to claim 14, wherein, in the step of growing the third p-side nitride semiconductor layer, the third nitride semiconductor layer is grown to a thickness in a range of 40 nm to 150 nm.

16. The method of manufacturing a nitride semiconductor light emitting element according to claim 15, wherein, in the step of growing the fourth p-side nitride semiconductor layer, the fourth nitride semiconductor layer is grown to a thickness in a range of 10 nm to 15 nm.

17. The method of manufacturing a nitride semiconductor light emitting element according to claim 1, wherein, in the step of growing the second p-side nitride semiconductor layer, the second nitride semiconductor layer is grown to a thickness in a range of 10 nm to 50 nm.

18. The method of manufacturing a nitride semiconductor light emitting element according to claim 1, wherein, in the step of growing the third p-side nitride semiconductor layer, the third nitride semiconductor layer is grown to a thickness in a range of 40 nm to 150 nm.

19. The method of manufacturing a nitride semiconductor light emitting element according to claim 1, wherein, in the step of growing the fourth p-side nitride semiconductor layer, the fourth nitride semiconductor layer is grown to a thickness in a range of 10 nm to 15 nm.

20. The method of manufacturing a nitride semiconductor light emitting element according to claim 1, wherein, light emitted from the active layer has a peak wavelength in a range of 350 nm to 410 nm.

\* \* \* \* \*